United States Patent
Baik

(10) Patent No.: US 6,211,712 B1
(45) Date of Patent: Apr. 3, 2001

(54) CMOS COMPARATOR WITH HYSTERESIS

(75) Inventor: Seung-Beom Baik, Yongin (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/324,425

(22) Filed: Jun. 1, 1999

(30) Foreign Application Priority Data

Jun. 2, 1998 (KR) .................................................. 98-20362

(51) Int. Cl.[7] .................................................. H03K 3/037
(52) U.S. Cl. .............................. 327/206; 327/63; 327/67; 327/68; 327/74; 327/80; 327/205; 327/206; 327/538
(58) Field of Search .................................. 327/63, 67, 68, 327/69, 71–77, 80, 205, 206, 538, 540, 541

(56) References Cited

U.S. PATENT DOCUMENTS

| | | | |
|---|---|---|---|
| 4,433,256 | * | 2/1984 | Dolikian ................................. 327/73 |
| 4,992,675 | * | 2/1991 | Conner, Jr. et al. .................... 327/72 |
| 5,047,663 | * | 9/1991 | Lee et al. ............................... 327/77 |
| 5,467,009 | * | 11/1995 | McGlinchey ........................... 327/50 |
| 5,990,707 | * | 11/1999 | Goldenberg et al. ................... 327/64 |

* cited by examiner

Primary Examiner—Timothy P. Callahan
Assistant Examiner—An T. Luu
(74) Attorney, Agent, or Firm—F. Chau & Associates, LLP

(57) ABSTRACT

A comparator with hysteresis having a simplified architecture such that the amount of hysteresis can be readily adjusted. In one aspect, a comparator with hysteresis comprises a first switch for coupling an analog input voltage to a signal node in response to a first clock signal; an inverter having an input port and an output port; a capacitor operatively coupled between the signal node and an input port of the inverter; a second switch operatively connected between the input port and the output port of the inverter, the second switch being responsive to the first clock signal; a latch having a clock port, an output signal port, an inverse output signal port, and an input data port, the input data port being coupled to the output port of the inverter; and a reference voltage control circuit for selectively outputting a first internal reference voltage and a second internal reference voltage to the signal node in response to the output signal and inverse output signal, respectively, received from the latch. Positive feedback holds a comparator in one of two states unless a sufficiently large input is applied to overcome the feedback.

16 Claims, 4 Drawing Sheets

CM OS COMPARATOR WITH HYSTERESIS

BACKGROUND

1. Technical Field

The present invention relates generally to a comparator and, more particularly, to a CMOS comparator with hysteresis.

2. Description of Related Art

In general, a comparator is a device which compares an input voltage with a reference voltage, amplifies the voltage differential between the input voltage and the reference voltage, and outputs a voltage signal of a high or low level based on the voltage differential. A comparator is typically employed in an analog-digital converter (such as a flash A/D converter), wherein an analog input signal is converted to a digital output signal by comparing the analog input signal with a plurality of reference voltages by using a complimentary metal-oxide semiconductor (CMOS) flash analog-digital converter.

Because of their high speed, flash analog-digital converters are widely employed in video devices, radar devices, laboratory instruments, and other devices which are used in high-speed applications. Other advantages associated with CMOS flash analog-digital converters are their compact size and low power dissipation, which enables them to be fabricated as monolithic integrated circuits.

For the comparator output voltage to be maintained at a high level state at a zero point, hysteresis is used to prevent the output voltage from changing as the input voltage is reduced. When the input voltage drops to a lower reference voltage (a negative trip point), the output voltage changes from the high level state to a low level state. The comparator output voltage will remain in the low level state as the input voltage increases. When the input voltage reaches an upper reference voltage (a positive trip point), the output voltage will change from the low level state to the high level state. The difference in voltage between the upper reference voltage and the lower reference voltage is known as the amount of the hysteresis. It is to be understood that the terms "high level state" (or "high") and "low level state" (or "low") used herein in connection with signals and logic levels are equivalent to logic levels "1" and "0", respectively.

Referring to FIG. 1, a circuit diagram illustrates a conventional comparator with hysteresis. Although there are many techniques known by those skilled in the art for providing hysteresis in a comparator, all of the conventional techniques employ some form of positive feedback. Consider the differential input stage as shown in FIG. 1. In this circuit, there are two feedback paths. The first feedback path is a current-series feedback through the common-source node of transistors M1 and M2, which is a negative feedback path. The second feedback path is the voltage-shunt feedback through the gate-drain connections of transistors M10 and M11, which is a positive feedback path. It is understood by those skilled in the art that if the positive feedback factor is less than the negative feedback factor, the overall feedback will be negative, thus resulting in no hysteresis. On the other hand, If the positive feedback factor is greater than the negative feedback factor, the overall feedback will be positive, which results in hysteresis (such as illustrated by the voltage transfer curve of FIG. 5).

A comparator is typically employed in a noisy environment, thereby requiring hysteresis to ensure a noise margin. With the conventional comparator shown in FIG. 1, the desired amount of hysteresis can be determined in accordance with the ratio of size of MOS transistors. Unfortunately, in order to control the trip voltages (and, therefore, the amount of the hysteresis), the comparator must be entirely reconstructed or an additional process is required for changing the ratio of size of transistors. As a result, it difficult to control the amount of the hysteresis. Another problem is that the conventional comparator also includes bias circuitry, which adds to the difficulty in controlling the amount of hysteresis.

SUMMARY OF THE INVENTION

The present invention is directed to a comparator with hysteresis having a simplified architecture such that the amount of hysteresis can be readily adjusted.

In one aspect of the present invention, a comparator with hysteresis comprises:

- a first switch for coupling an analog input voltage to a signal node in response to a first clock signal;
- an inverter having an input port and an output port;
- a capacitor operatively coupled between the signal node and the input port of the inverter;
- a second switch operatively connected between the input port and the output port of the inverter, the second switch being responsive to the first clock signal;
- a latch having a clock port, an output signal port, an inverse output signal port, and an input data port, the input data port being coupled to the output port of the inverter; and
- a reference voltage control circuit for selectively outputting a first internal reference voltage and a second internal reference voltage to the signal node in response to the output signal and inverse output signal, respectively, received from the latch.

In another aspect of the present invention, the reference voltage control circuit has a logic circuit for outputting control signals responsive to a second clock signal and the output signals of the latch. A reference voltage generating circuit outputs selectively a first internal reference voltage and a second internal reference voltage among a plurality of the internal reference voltages based on a first and second external reference voltages to the signal node. Second analog switches outputs selectively one of the first and the second internal reference voltages to the signal node.

In yet another aspect of the present invention, the reference voltage control circuit of the comparator comprises:

- a logic circuit for outputting one of a first and second control signal in response to a second clock signal and the output signal and inverse output signal of the latch;
- a reference voltage generating circuit for outputting the first internal reference voltage and the second internal reference voltage to the signal node, the first internal reference voltage and the second internal reference voltage being selected from a plurality of available reference voltages generated by dividing a first and a second external reference voltage; and
- a third and fourth switch for selectively outputting the first and second internal reference voltages, respectively, to the signal node, in response to the first and second control signals, respectively.

In another aspect of the present invention, a comparator having a controllable amount of hysteresis, comprises:

- means for comparing an input voltage with one of an upper threshold voltage and a lower threshold voltage depending on an output state of the comparator, wherein the difference between the upper and lower threshold voltages is the amount of hysteresis; and means for adjusting the amount of hysteresis by selecting a first one of a plurality of reference voltages as the upper threshold voltage and for selecting a second one of the plurality of reference voltages as the lower threshold voltage.

These and other aspects, features and advantages of the present invention will be described and become apparent from the following detailed description of preferred embodiments, which is to be read in connection with the accompanying drawings.

DETAILED DESCRIPTION OF PREFERRED EMBODIMENTS

Figure 1:
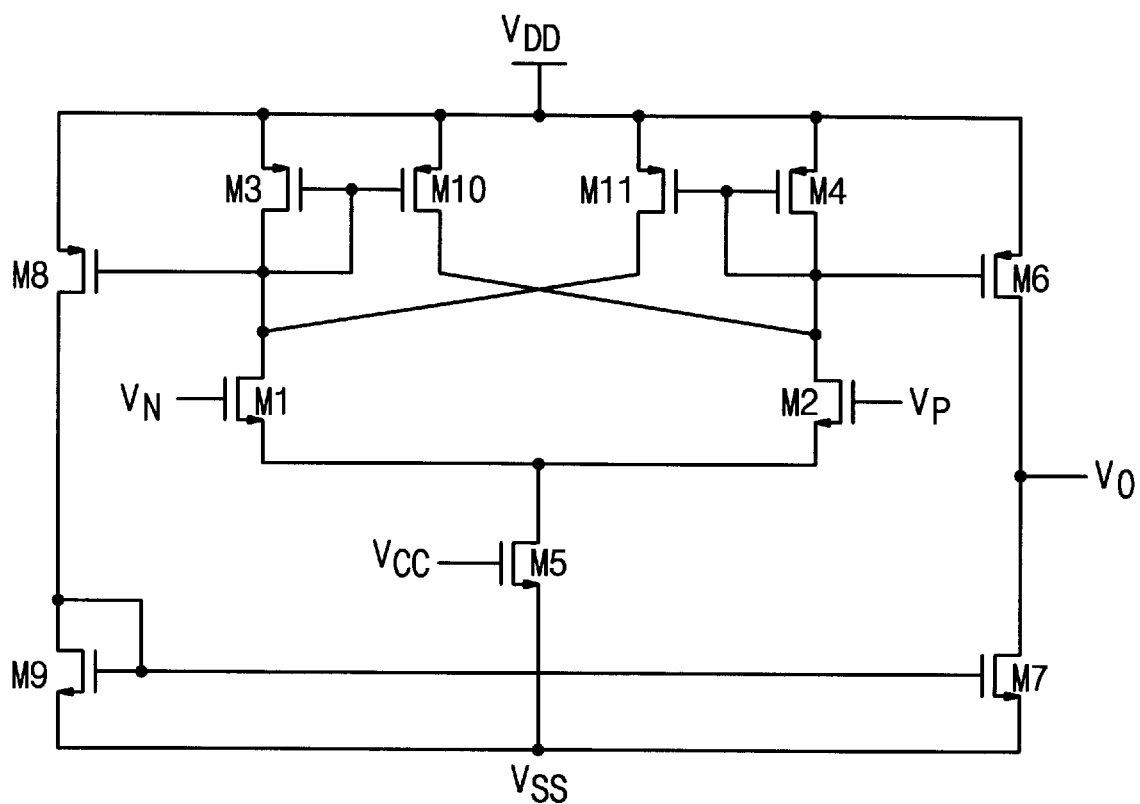
FIG. 1 is a diagram of a conventional comparator with hysteresis.
Figure 2:
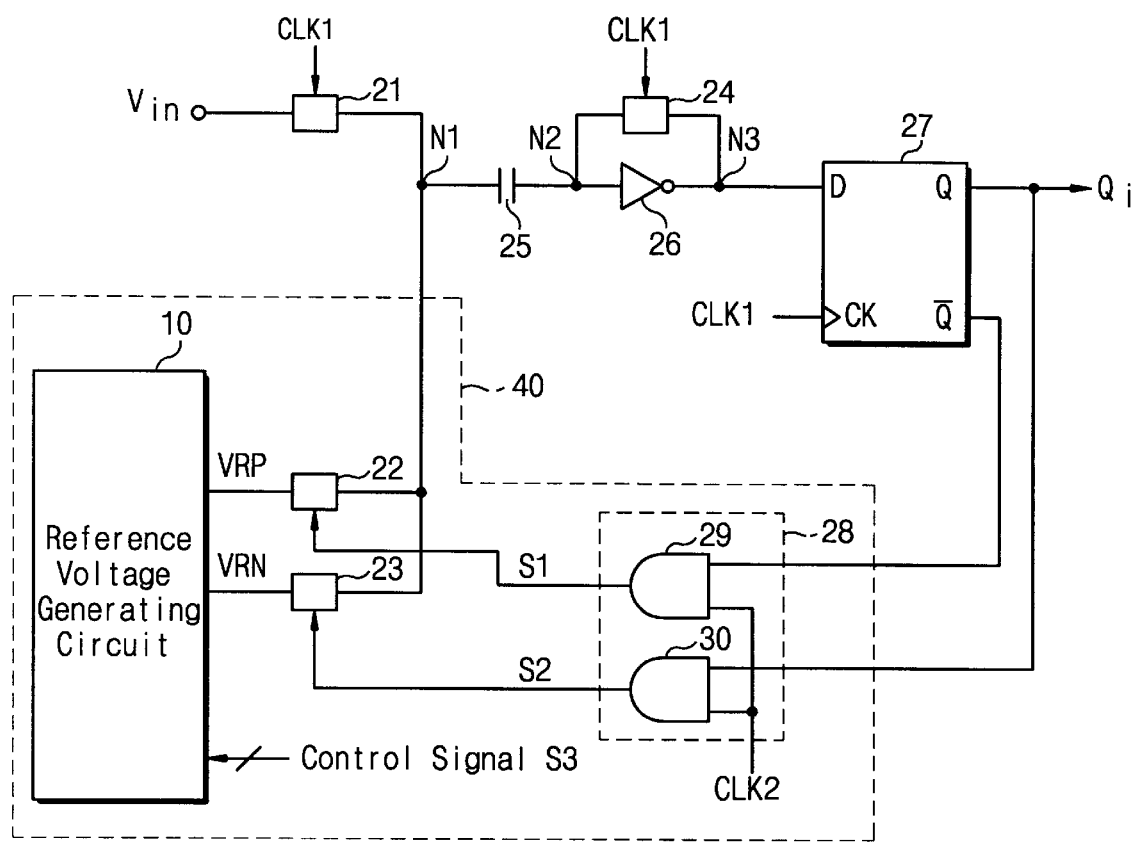
FIG. 2 is a diagram illustrating a comparator with hysteresis in accordance with an embodiment of the present invention.

Referring now to FIG. 2, diagram illustrates a comparator with hysteresis in accordance with one embodiment of the present invention. The comparator receives as input an analog input voltage Vin. The comparator generates a first and second internal reference voltage $V_{RP}$ and $V_{RN}$, which determine the amount of hysteresis. The comparator comprises analog switches 21 and 24, a capacitor 25, an inverter 26, a latch 27, and a reference voltage control circuit 40. The reference voltage control circuit 40 includes a reference voltage generating circuit 10, switches 22 and 23, and a logic circuit 28. The inverter 26 includes an input port N2 (or alternatively referred to as "node N2") and an output port N3 (alternatively referred to as "node N3"). The inverter 26 generates a logic level signal which is output to node N3. The inverter 26 is preferably a CMOS inverter. The capacitor 25 is coupled between signal node N1 and node N3 (i.e., the input port of the inverter 26). The analog switch 21 supplies an analog input voltage Vin to the signal node N1 in response to a first clock signal CLK1. The analog switch 24 is coupled between node N2 and node N3 of the inverter 26.

The latch 27 comprises a clock port CK, output ports Q and $\overline{Q}$, and an input data port D coupled to the output port N3 of the inverter 26. The latch 27 generates a signal and an inverse signal which are output from ports Q and $\overline{Q}$, respectively, in accordance with the logic level signal of the output port N3 of the inverter 26.

The reference voltage control circuit 40, operatively coupled between the signal node N1 and the output ports Q and $\overline{Q}$ of the latch 27, selectively outputs the first and second internal reference voltages $V_{RP}$ and $V_{RN}$ to the signal node N1 based on the output signals of the latch 27. In particular, the reference voltage control circuit 40 comprises a logic circuit 28 which generates switch control signals S1 and S2 in response to a second clock signal CLK2 and the output signals of the latch 27 to selectively control switches 22 and 23. In response to the switch control signals S1 and S2, the reference voltage generating circuit 10 will selectively output the internal reference voltages $V_{RP}$ and $V_{RN}$ to the signal node N1. As explained in detail below, the magnitude of the internal reference voltages $V_{RP}$ and $V_{RN}$ can be varied to control the amount of hysteresis. The analog switches 22 and 23 selectively output one of the first and second internal reference voltages $V_{RP}$ and $V_{RN}$ to the signal node N1. The reference voltage generating circuit 10 generates the first and second internal reference voltages $V_{RP}$ and $V_{RN}$ in response to an externally applied control signal S3.

The logic circuit 28 comprises a first AND gate 29 and a second AND gate 30. The first AND gate 29 receives the second clock signal CLK2 and the inverse output signal $\overline{Q}$ from the latch 27 and then outputs the first switch control signal S1 to control switch 22. The second AND gate 30 receives the second clock signal CLK2 and output signal Q from the latch 27, and then outputs the second control signal S2 to control switch 23. When activated, switch 22 and switch 23 couple the first and second internal reference voltages $V_{RP}$ and $V_{RN}$ to the signal node N1, respectively. In particular, the first control signal S1 activates switch 22, which causes the first internal reference voltage $V_{RP}$ to be output from the reference voltage generating circuit 10 to the signal node N1. The second control signal S2 activates switch 23, which causes the second internal reference voltage $V_{RN}$ to be output from the reference voltage generating circuit 10 to the signal node N1.

The first clock signal CLK1 controls switches 21 and 24 by turning them on and off. When activated, switch 21 couples the analog input voltage Vin to the signal node N1 and switch 24 couples the input node N2 of the inverter 26 to the output node N3 of the inverter 26. The first and second clock signals CLK1 and CLK2 are complementary to each other. When the clock signal CLK1 is high and the clock signal CLK2 is low, the switch 21 is activated and switches 22 and 23 are deactivated. When the clock signal CLK1 is low and the clock signal CLK2 is high, switch 21 is deactivated and switches 22 and 23 are activated. The logic circuit 28 is controlled by the second (complementary) clock signal CLK2.

The latch 27 is controlled by the clock signal CLK1 (which is input to the clock port CK). The latch 27 may be any conventional circuit comprising a data input port D and a clock port CK and two data output ports Q and $\overline{Q}$. When the clock signal CLK1 is high, the signal from the data output port Q has the same logic level as the signal at the data input port D. When the clock signal CLK1 goes low, the current logic level of the signal from the data output port Q is latched, and the signal level at the data output port Q remains at that logic level until the clock signal CLK1 goes high again.

The logic circuit 28 comprises a first and second two-input AND gates 29 and 30 and is controlled by the second clock signal CLK2. In particular, the two inputs of the AND gate 29 are the clock signal CLK2 and the output signal from the output port $\overline{Q}$ of the latch 27, respectively. Moreover, the two inputs of the AND gate 30 are the clock signal CLK2 and the output signal from the output port Q of the latch 27, respectively. The AND gates 29 and 30 generate the switch control signals S1 and S2. The switch control signals S1 and S2 respectively drive switches 22 and 23.

Figure 3:
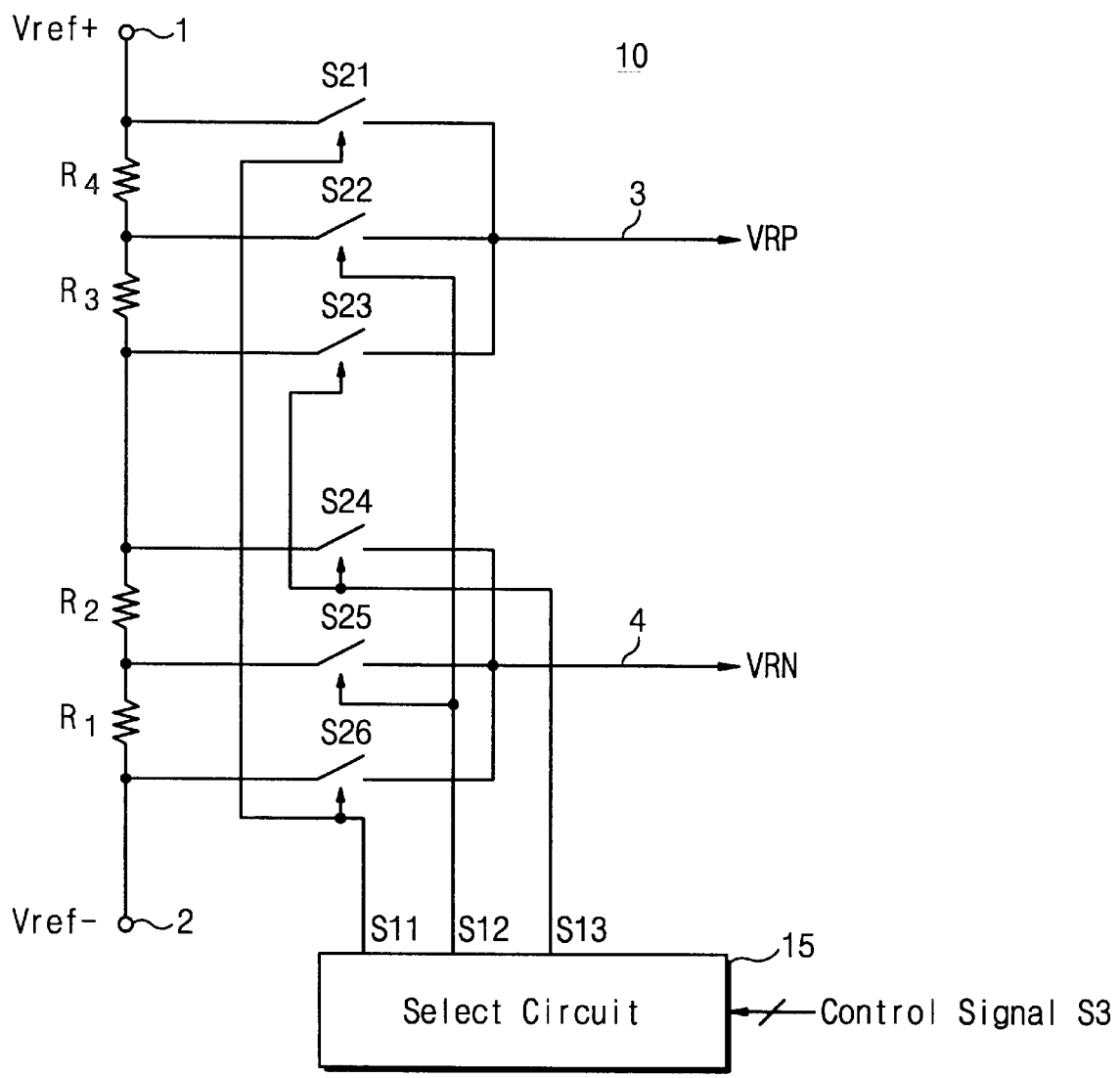
FIG. 3 is a detailed circuit diagram illustrating a preferred embodiment of the reference voltage generating circuit of FIG. 2.

Referring now to FIG. 3, a diagram illustrates a preferred embodiment of the reference voltage generating circuit 10. The reference voltage generating circuit 10 comprises a first node 1 for receiving a first external reference voltage Vref+, and a second node 2 for receiving a second external reference voltage Vref−. A plurality of resistors R1–R4, serially coupled between the first and second nodes 1 and 2, are employed for dividing the external reference voltages Vref+ and Vref− into a plurality of internal reference voltages.

The internal reference voltages (which are divided by the resistors R1–R4) are selectively output through the plurality of switches S21–S26, such that the first internal reference voltage $V_{RP}$ is output to a first output port 3, and the second internal reference voltage $V_{RN}$ is output to a second output port 4. The plurality of switches S21–S26 are controlled by a plurality of select signals S11–S13 from a select circuit 15. The select circuit 15 is controlled by the externally applied control signal S3. The control signal S3 is preferably a select signal (e.g., 2 bits) supplied from a main controller (not shown).

The plurality of switch S21–S26 comprise two switch groups. As shown, the first switch group has M switches, e.g., switches S21–S23, and a second switch group has N switches, e.g., switches S24–S26. The first switch group outputs the first internal reference voltage $V_{RP}$ to the first output port 3 in response to the select signals S11–S13 from the select circuit 15. The second switch group outputs the second internal reference voltage $V_{RN}$ to the second output port 4 in response to the select signals S11–S13 from the select circuit 15. With this embodiment, it is to be appreciated that the trip voltages can be controlled by the switches, e.g., switches S21–S26, thereby controlling the amount of the hysteresis of the comparator.

It is to be understood that the reference voltage generating circuit has been described comprising 3 switches for the first and second switch groups solely for purposes of illustration and convenience and that one of skilled in the art may implement any number of the above described switches in the reference voltage generating circuit 10 depending on the application. It is to be further understood that the reference voltage generating circuit 10 may comprise any number of resistors for generating a plurality of divided voltages and outputting a desired voltage among the divided voltages.

Referring again to FIG. 2, when the reference voltage generating circuit 10 outputs the first and second internal reference voltages $V_{RP}$ and $V_{RN}$, the respective switches 22 and 23 is activated, thereby supplying one of the first and second internal reference voltage $V_{RP}$ and $V_{RN}$ to the signal node N1. The comparator generally operates by comparing the input analog voltage Vin with either the first and second internal reference voltages $V_{RP}$ and $V_{RN}$, whichever is currently supplied to node N1. Specifically, the switches 21 and 24 are simultaneously activated by clock signal CLK1, so that the analog input voltage Vin is supplied to the signal node N1. Since the input node N2 of the inverter 26 is coupled to the capacitor 25, the voltage of node N2 is supplied by a self-bias voltage caused by properly controlling in the ratio of the size of the MOS transistors of the inverter 26. For example, when the analog input voltage is 2 V and the voltage of the input node N2 is 1.5 V caused by the self-bias voltage, the voltage of the capacitor 25 is Vin−V2 (2 V−1.5 V). The self-bias voltage is determined based on the ratio of the size of NMOS and PMOS transistors of the inverter 26, which typically is approximately Vdd/2.

Figure 4:
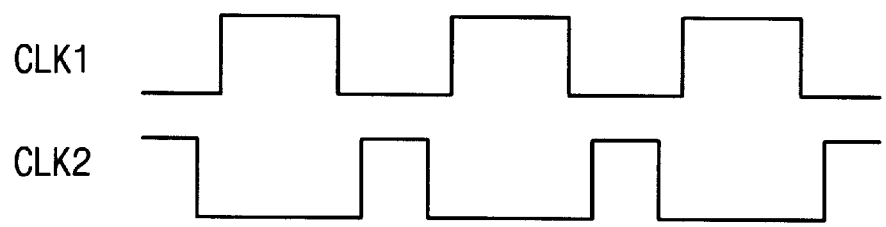
FIG. 4 is a timing diagram illustrating complementary clock signals used for operating the comparator of FIG. 2.

FIG. 4 is a timing diagram of the clock signals CLK1 and CLK2. As shown, the clock signal CLK1 is complementary to the clock signal CLK2. When the switch 21 is deactivated by the clock signal CLK1 and the switch 22 is activated by the first control signal from the logic circuit 28, the first internal reference voltage $V_{RP}$, e.g. 1.6 V is supplied to the signal node N1. When switch 21 is deactivated, the switch 24 coupled between the input port N2 and output port N3 of the inverter 26 is also deactivated. The voltage of the input node N2 applied by the self-bias voltage is dropped as much as the voltage of the signal node N1, e.g. 2 V−1.6 V, so that the voltage of the input node N2 becomes 1.1 V.

The inverter 26 inverts the signal at node N2 and outputs a logic 1 signal to the output node N3 thereof. The latch 27 receives the logic 1 signal at the data input port D, and then outputs a logic 1 signal to the output port Q and outputs the inverse output signal (i.e., logic 0) to the output port. These output signals are supplied to the logic circuit 28 (i.e, the AND gates 29 and 30).

Although the AND gates 29 and 30 receive the clock signal CLK2 (of logic 1) simultaneously, the output signal from the output port Q of the latch 27 is complementary to the output signal from the output port $\overline{Q}$ such that the switch control signals S1 and S2 output from AND gates 29 and 30 are not output to the switches 22 and 23 simultaneously.

The switches 21 and 24 are simultaneously activated by the clock signal CLK1 when the analog input voltage Vin is input. When the clock signal CLK1 is logic 0 and the clock signal CLK2 is logic 1, one of the switches 22 and 23 will be activated by one of the first and second control signals S1 and S2 from the logic circuit 28. As a result, one of the first and second internal reference voltages $V_{RP}$ and $V_{RN}$ is output from the reference voltage generating circuit 10 to the signal node N1.

During operation of the comparator of FIG. 2, the analog input signal Vin will be compared with one of the first and second internal reference voltages $V_{RP}$ and $V_{RN}$. Assume that the analog input signal Vin is first compared with the first internal reference voltage $V_{RP}$. The voltage $V_{N2}$ of the input node N2 becomes −(Vin−$V_{RP}$) pursuant to the theory of charge conservation. Since the switch 24 is deactivated, the voltage of the input node N2 is shown as much as an amount of the voltage variation of the analog input signal Vin.

Accordingly, the output voltage $V_{N3}$ of the inverter 26 becomes −A[$V_{N2}$−(Vin−$V_{RP}$)]. Thereafter, the voltage $V_{N2}$ of the input node N2 applied by the self-bias voltage is dropped as much as the voltage of the signal node N1, e.g. 2 V−1.6 V, so that the voltage $V_{N2}$ of the input node N2 becomes 1.1 V. Thus, the output voltage $V_{N3}$ of the inverter 26 becomes the high level signal. Since this high level signal is input to the data input port D of the latch 27, the latch 27 outputs the output signal from the output port Q.

When the output signal Q of the latch 27 is logic 1, the switch 23 is activated. The reference voltage generating circuit 10 then outputs the second internal reference voltage $V_{RN}$, which is less than the first internal reference voltage $V_{RP}$. Accordingly, the amount of the hysteresis of the comparator is based on the second internal reference voltage $V_{RN}$.

The analog input signal Vin is higher than the second internal reference voltage $V_{RN}$. Although the noise is input to the analog input signal Vin, the output signal of the latch 27 keeps the high level signal so long as the analog input signal Vin is greater than the second internal reference voltage $V_{RN}$. When the analog input signal Vin becomes less than the second internal reference voltage $V_{RN}$, the output signal Q of the latch 27 becomes logic 0.

The switch 22 is then activated by the high level signal (switch control signal S1) output from AND gate 29, and the reference voltage generating circuit 10 outputs the first internal reference voltage $V_{RP}$, which is greater than the second internal reference voltage $V_{RN}$. Accordingly, the amount of the hysteresis of the comparator is determined by the first internal reference voltage $V_{RP}$. Therefore, as described above, the amount of the hysteresis $\Delta V_H$ may be controlled by the first internal reference voltage $V_{RP}$ and the second internal reference voltage $V_{RN}$.

Figure 5:
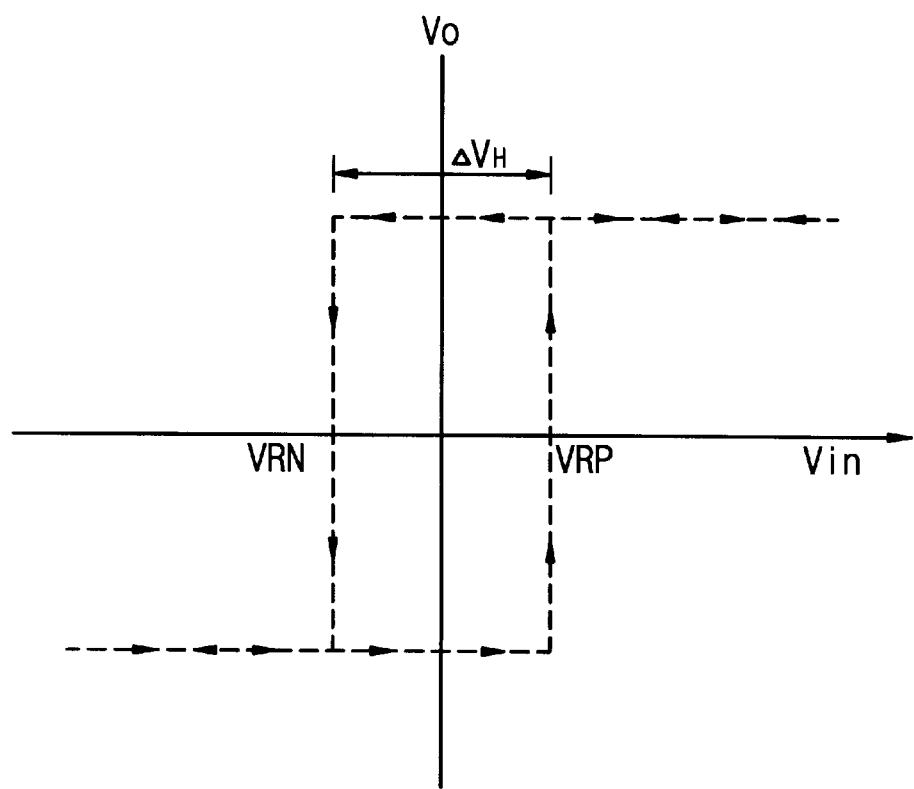
FIG. 5 is a transfer characteristic graph of the comparator with the hysteresis.

Referring now to FIG. 5, a transfer characteristic graph illustrated hysteresis of the comparator of FIG. 2. As explained above, hysteresis is a characteristic of the comparator in which the input threshold voltage changes as a function of the input or output level. In particular, when the analog input voltage passes the threshold, the output voltage changes and the input threshold voltage is subsequently reduced so that the analog input voltage must return beyond the previous threshold voltage before the comparator's output voltage changes state again. This is illustrated with the diagram of FIG. 5.

Notice that as the analog input voltage Vin starts negative and goes positive, the output voltage Vo does not change until it Vin reaches the positive trip point $V_{RP}$. Once the output voltage goes high, the effective trip point is changed. When the analog input voltage Vin decreases in the negative direction, the output voltage Vo does not switch from logic high to logic low until Vin reaches the negative trip point $V_{RN}$. The advantage of hysteresis in a noisy environment may clearly be seen.

The first internal reference voltage $V_{RP}$ is an upper threshold voltage (a positive trip point) with the hysteresis when the output voltage is changed from a low level to a high level, and the second internal reference voltage $V_{RN}$ is a lower threshold voltage (a negative trip point) with the hysteresis when the output voltage is changed from the high level to the low level.

The output voltage of the comparator remains at logic 1 until the analog input voltage reaches to the lower threshold voltage, e.g. the second internal reference voltage $V_{RN}$ from the initial state of logic 1. However, when the analog input voltage Vin decreases below the lower threshold voltage, e.g. the second internal reference voltage $V_{RN}$, the output voltage switches to logic 0. As the analog input voltage Vin increases, the output voltage remains at logic 0 until the analog input voltage reaches to the upper threshold voltage, e.g. the first internal reference voltage $V_{RP}$, at which time the output signal switches to logic 1. When the clock CLK2 is active, the upper and lower threshold voltage is selected by the AND gates 29 and 30 of the logic circuit 28.

As described above, the upper and lower threshold voltages are the first and second internal reference voltages $V_{RP}$ and $V_{RN}$ which are compared with the analog input voltage. The first and second internal reference voltages $V_{RP}$ and $V_{RN}$ are generated by voltage dividing a pair of external voltages using a plurality of resistors, and selected one of the first group switches and one of the second group switches. Since the amount of hysteresis $\Delta V_H$ can be selectively varied by modifying the difference of the upper and the lower threshold voltages, the select circuit 15 outputs the select signal which controls the switches in order to output the divided voltage to the first and second output ports 3 and 4.

Advantageously, the comparator with hysteresis described above in accordance with the present invention comprises a reference voltage generating circuit which comprises a plurality of resistors that allows the magnitude of the internal reference voltages to be controlled, thereby controlling the amount of hysteresis of the comparator. Since the internal reference voltages of the reference voltage generating circuit may easily be generated, the comparator requires neither reconstruction nor additional processes to control the hysteresis, thereby simplifying the manufacture of the comparator.

Although illustrative embodiments have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A comparator with hysteresis, comprising:
   a first switch for coupling an analog input voltage to a signal node in response to a first clock signal;
   an inverter having an input port and an output port;
   a capacitor operatively coupled between the signal node and the input port of the inverter;
   a second switch operatively connected between the input port and the output port of the inverter, the second switch being responsive to the first clock signal;
   a latch having a clock port, an output signal port, an inverse output signal port, and an input data port, the input data port being coupled to the output port of the inverter; and
   a reference voltage control circuit for selectively outputting a first internal reference voltage and a second internal reference voltage to the signal node in response to the output signal and inverse output signal, respectively, received from the latch.

2. The comparator of claim 1, wherein the comparator is a CMOS comparator.

3. The comparator of claim 1, wherein the reference voltage control circuit comprises:
   a logic circuit for outputting one of a first and second control signal in response to a second clock signal and the output signal and inverse output signal of the latch;
   a reference voltage generating circuit for outputting the first internal reference voltage and the second internal reference voltage to the signal node, the first internal reference voltage and the second internal reference voltage being selected from a plurality of available reference voltages generated by dividing a first and a second external reference voltage; and
   a third and fourth switch for selectively outputting the first and second internal reference voltages, respectively, to the signal node, in response to the first and second control signals, respectively.

4. The comparator of claim 3, wherein the reference voltage generating circuit comprises:
   a first node for receiving the first external reference voltage;
   a second node for receiving the second external reference voltage;
   a plurality of resistors, serially connected between the first node and the second node, for dividing the external reference voltages to generate the plurality of reference voltages; and
   a plurality of switches for selecting a corresponding one of the plurality of reference voltages in response to an external control signal.

5. The comparator of claim 4, wherein the reference voltage generating circuit further comprises a select circuit for selectively outputting a plurality of select signals in response to the external control signal, and wherein the plurality of switches are divided into a first switch group and a second switch group, the first switch group being connected to a first output port for selectively outputting the first internal reference voltage in response to a first corresponding select signal, and the second switch group being connected to a second output port for selectively outputting the second internal reference voltage in response to a second corresponding select signal.

6. The comparator of claim 1, wherein the first and second internal reference voltages are different voltage levels as compared to each other.

7. The comparator of claim 5, wherein the first internal reference voltage is an upper threshold voltage with the hysteresis when the output voltage of the first internal reference voltage is changed from a low level to a high level, and the second internal reference voltage is a lower threshold voltage with the hysteresis when the output voltage of the second internal reference voltage is changed from the high level to the low level.

8. The comparator of claim 3, wherein the logic circuit comprises:
   a first AND gate for receiving the inverse output signal from the latch and generating the first control signal in response to the second clock signal; and
   a second AND gate for receiving the output signal of the latch and generating the second control signal in response to the second clock signal.

9. The comparator of claim 3, wherein the first and second clock signals are complementary to each other.

10. A comparator having a controllable amount of hysteresis, comprising:
    means for comparing an input voltage with one of an upper threshold voltage and a lower threshold voltage depending on an output state of the comparator; and
    means for adjusting the amount of hysteresis by selecting the upper threshold voltage from a plurality of upper threshold voltages and selecting the lower threshold voltage from a plurality of lower threshold voltages, wherein the difference between the selected upper and lower threshold voltages is the amount of hysteresis.

11. The comparator of claim 10, wherein the upper threshold voltage is compared with the input voltage when the output state is changed from a low level to a high level, and the lower threshold voltage is compared with the input voltage when the output state is changed from the high level to the low level.

12. The comparator of claim 10, wherein the means for adjusting the amount of hysteresis comprises a reference voltage generating circuit comprising:
    a voltage divider for dividing at least one externally applied reference voltage to generate the plurality of upper threshold voltages and the plurality of lower threshold voltages; and
    selection means for selecting one of the plurality of upper threshold voltages and one of the plurality of lower threshold voltages to adjust the amount of hysteresis of the comparator.

13. The comparator of claim 12, wherein the voltage divider comprises:
    a first node for receiving a first external reference voltage;
    a second node for receiving a second external reference voltage;
    a plurality of resistors, serially connected between the first node and the second node, for dividing the first and second external reference voltages to generate the plurality of upper and lower threshold voltages.

14. The comparator of claim 13, wherein the selection means comprises a plurality of switches for selecting a corresponding one of the plurality of upper and lower threshold voltages in response to an external control signal.

15. The comparator of claim 14, wherein the reference voltage generating circuit further comprises a select circuit for selectively outputting a plurality of select signals in response to the external control signal, and wherein the plurality of switches are divided into a first switch group and a second switch group, the first switch group being connected to a first output port for selectively outputting the upper threshold voltage in response to a corresponding select signal, and the second switch group being connected to a second output port for selectively outputting the lower threshold voltage in response to a corresponding select signal.

16. The comparator of claim 10, wherein the comparator is a CMOS comparator.

* * * * *